United States Patent [19]

Parkes

[11] Patent Number: 5,311,193
[45] Date of Patent: May 10, 1994

[54] DIGITAL CHIRP GENERATOR

[75] Inventor: Stephen M. Parkes, Bristol, United Kingdom

[73] Assignee: British Aerospace Public Limited Company, London, England

[21] Appl. No.: 760,199

[22] Filed: Sep. 16, 1991

[30] Foreign Application Priority Data

Sep. 26, 1990 [GB] United Kingdom ............... 9020953

[51] Int. Cl.$^5$ ............................................. G01S 7/282
[52] U.S. Cl. ...................... 342/201; 342/202; 342/204
[58] Field of Search .............. 342/200, 201, 202, 203, 342/204

[56] References Cited

U.S. PATENT DOCUMENTS

| | | | |
|---|---|---|---|
| 3,731,311 | 5/1973 | Williams | 342/201 |
| 3,842,354 | 10/1974 | Dunne | 328/14 |
| 4,047,173 | 9/1977 | Miller | 342/201 |
| 4,121,211 | 10/1978 | Cusack | 342/200 |
| 4,275,398 | 6/1981 | Parker et al. | 342/463 |
| 4,593,287 | 6/1986 | Nitardy | 342/200 |
| 4,598,293 | 7/1986 | Wong | 367/101 X |
| 4,667,200 | 5/1987 | Gellekink et al. | 342/202 |
| 4,688,043 | 8/1987 | Welsh | 342/149 |
| 4,847,624 | 7/1989 | Hopwood et al. | 342/201 |
| 4,943,779 | 7/1990 | Pedersen et al. | 328/14 |
| 4,956,799 | 9/1990 | Nakayama | 364/729 |
| 5,031,131 | 7/1991 | Mikos | 364/721 |
| 5,053,779 | 10/1991 | Dewhirst | 342/195 |
| 5,194,870 | 3/1993 | Pearce et al. | 342/128 |

FOREIGN PATENT DOCUMENTS

| | | |
|---|---|---|
| 0297588 | 1/1989 | European Pat. Off. |
| 8606517 | 11/1986 | PCT Int'l Appl. |
| 2196455 | 4/1988 | United Kingdom . |
| 2217127 | 10/1989 | United Kingdom . |
| 2224899 | 5/1990 | United Kingdom . |

*Primary Examiner*—John B. Sotomayor
*Attorney, Agent, or Firm*—Cushman, Darby & Cushman

[57] ABSTRACT

A digital chirp generator for generating linear frequency modulated signals, comprises a plurality of frequency/phase accumulators pipelined together. Each frequency/phase accumulator includes a frequency accumulator driving phase accumulator. In the pipelined configuration the frequency accumulator and the phase accumulator of each frequency/phase accumulator are interconnected with the corresponding frequency accumulator and phase accumulator adjacent of the frequency/phase accumulator.

19 Claims, 12 Drawing Sheets

FA[n] = Output of Frequency Adder [n]
SF[n] = Start Frequency Parameter [n]

OLD[n] = Previous value of frequency increment for accumulator n.
NEW[n] = New value of frequency increment for accumulator n.

DIGITAL CHIRP GENERATOR

This invention relates to a digital chirp generator.

Digital chirp generation is a well known technique for generating linear frequency modulated signals widely used in radar and sonar applications.

A conventional form of digital chirp generator is illustrated in FIG. 1 of the accompanying drawings. It comprises a frequency accumulator, a phase accumulator, sine/cosine look-up tables, and digital to analogue converters. The frequency and phase accumulators are n-bit accumulators.

A need exists for a digital chirp generator which can be implemented using existing technology but which is capable of operating at higher speeds than conventional generators.

Accordingly, in one aspect, this invention provides a digital chirp generator comprising a plurality of frequency/phase accumulators, each of the frequency/phase accumulators including a frequency accumulator means driving a phase accumulator means, the plurality of frequency/phase accumulators are pipelined together wherein each frequency accumulator means is pipelined to the frequency accumulator means in the next adjacent frequency/phase accumulator and phase each adjacent frequency/phase accumulator means is pipelined to the phase accumulator means in the next adjacent frequency/phase accumulator.

It is to be understood that, whilst described as a digital chirp generator, the apparatus may be used simply as a frequency generator if the ramp rate input (otherwise referred to herein as the frequency increment value) of the chirp generator is set at zero.

The frequency and phase accumulators referred to herein are typically digital accumulators which accumulate digital values representative of frequency or phase, as the case may be.

In another aspect, this invention provides a digital chirp generator of the type defined above having means for loading the start frequency value and/or the start phase value into the associated frequency accumulator and/or phase accumulator.

In a further aspect, this invention provides a digital chirp generator of the type described above having means for loading the frequency increment value into the frequency/phase accumulator without the need to provide an array of pipeline registers or similar to compensate for the pipeline delay in the frequency/phase accumulator array.

In another aspect, the invention provides a digital chirp generator of the type described above having means for substantially simultaneously loading the frequency increment value and at least one of the frequency start value and phase start value into the frequency/phase accumulator using a single pipelined control signal, without the need for an array of pipeline registers to compensate for the pipeline delay in the frequency/phase accumulator array.

In a further aspect, the invention provides a digital frequency generator comprising a plurality of phase accumulators pipelined together.

Whilst the invention has been described above it includes any inventive combination of the features set out above or below.

The invention may be performed in various ways and five embodiments thereof will now be described by way of example only, reference being made to the accompanying drawings, in which.

Figure 1:
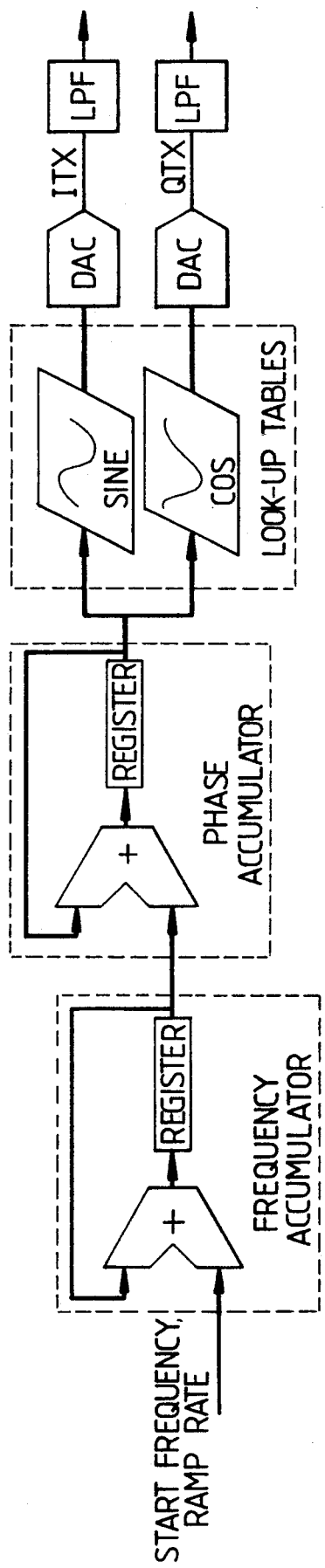
FIG. 1 is a block diagram of a conventional digital chirp generator.

In each of the five embodiments, the conventional arrangement of FIG. 1 which comprises an n-bit frequency accumulator and an n-bit phase accumulator is replaced by a pipelined array of smaller accumulator circuits. For example, if n-bit frequency and phase accumulators are required then the embodiments may be constructed as m pipelined frequency/phase accumulators each of p-bits where $n = m \times p$.

Figure 2:
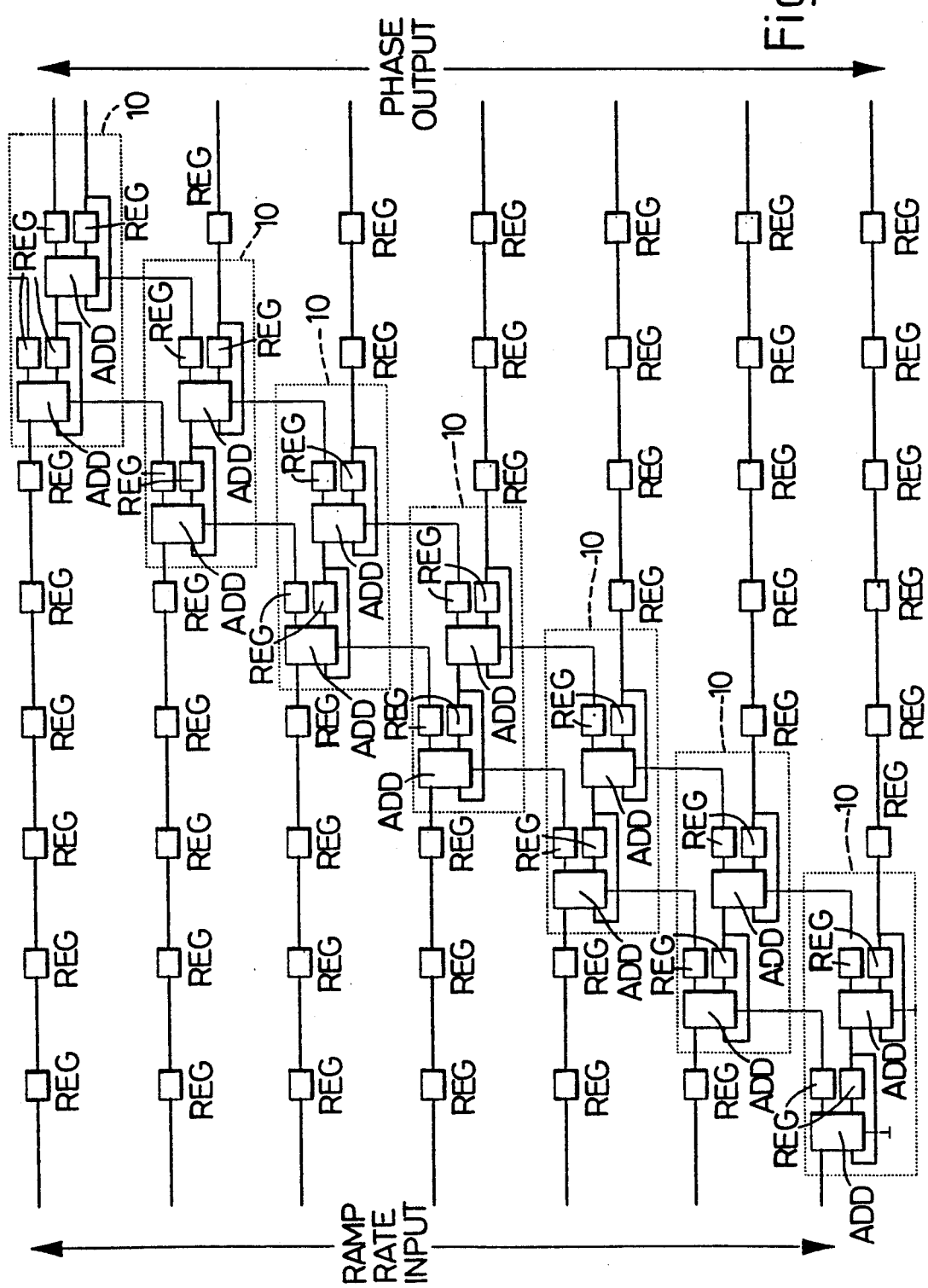
FIG. 2 is a block diagram of a first embodiment of a parallel-pipelined digital chirp generator in accordance with the invention.

A first embodiment of pipelined frequency/phase accumulator is shown in FIG. 2. It comprises m, p-bit frequency/phase accumulators 10. A master clock signal is used to load intermediate results into all the pipeline registers simultaneously. Note that, for clarity, the loading of the start frequency parameter will be considered later.

Figure 3:
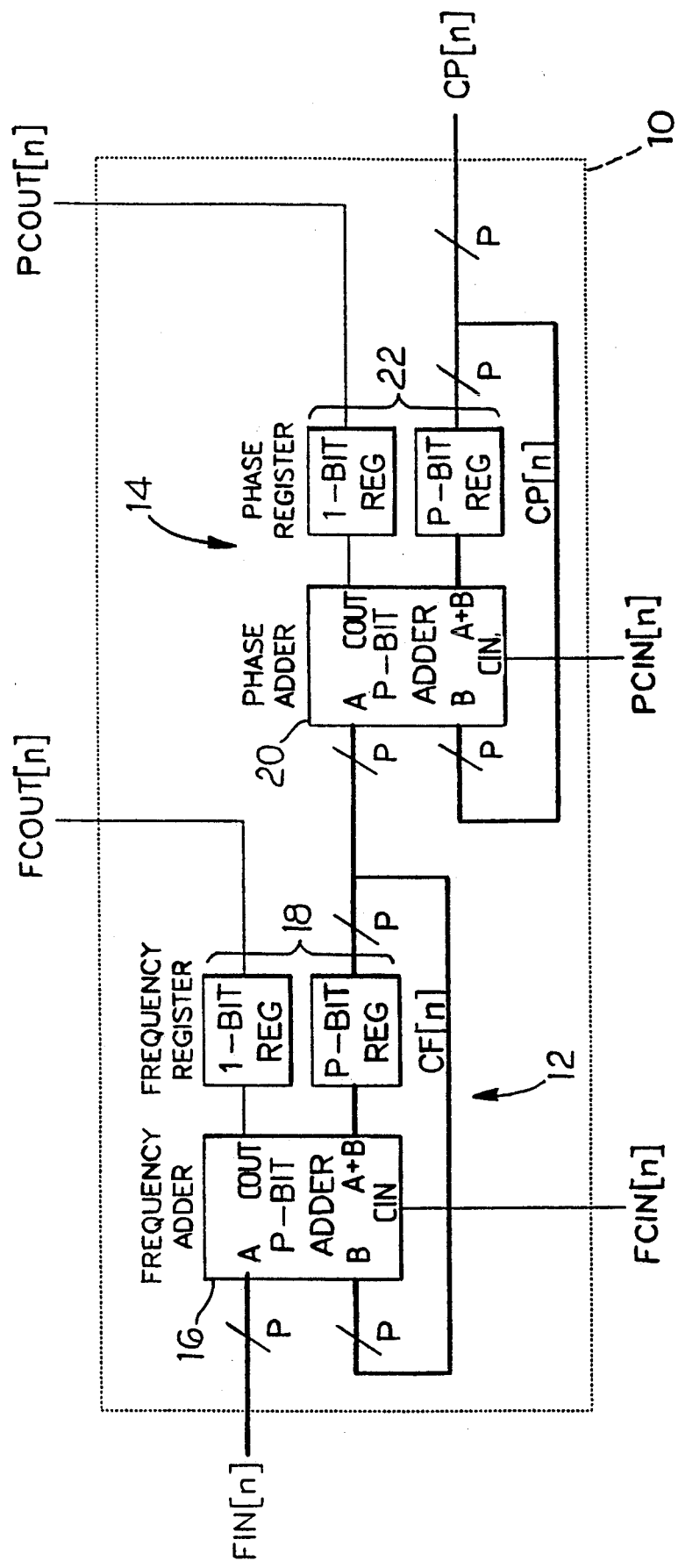
FIG. 3 is a block diagram of one of the p-bit frequency/phase accumulators used in the chirp generator of FIG. 2.

Consider first one of the p-bit frequency/phase accumulators (see FIG. 3). It consists of a p-bit frequency accumulator 12 and a p-bit phase accumulator 14. The frequency accumulator is constructed from a p-bit full adder (frequency adder) 16 and a (p+1)-bit pipeline register (frequency register) 18. Similarly the phase accumulator is constructed from a p-bit adder (phase adder) 20 and a (p+1)bit pipeline register (phase register) 22.

The inputs to the frequency/phase accumulator comprise a pipelined carry input (FCIN[n]) and a p-bit frequency increment input (FIN[n]). These inputs are added to the current frequency (CF[n]) held in the frequency register 18 by the frequency adder 16. The result is a new p-bit frequency value (CF[n+1]) and a carry output (FCOUT[n]). These new values are loaded into the current frequency pipeline register 18 by the master clock.

The p-bit pipelined current frequency value (CF[n]) is fed back to the input of the frequency adder 16 and also passed on to the input of the phase accumulator 14. The phase accumulator operates in the same way as the frequency accumulator. It adds the pipelined phase carry input (PCIN[n]) and the phase accumulator input (CF[n]), to the current phase value (CP[n]) held in the phase register 22. The result is a new current phase value (CP[n+1]) and a phase carry output signal (PCOUT[n]).

Consider now, the position of one p-bit frequency/phase accumulator 10 in the middle of the chain of m frequency/phase accumulators. This $N^{th}$ frequency/phase accumulator will receive its frequency and phase carry inputs (FCIN[N]) and (PCIN[N]) from the carry outputs of the $N-1^{th}$ frequency/phase accumulator (FCOUT[N−1] and PCOUT[N−1]). Similarly the $N^{th}$ frequency/phase accumulator will pass its carry outputs (FCOUT[N]) to the carry inputs of the $N+1^{th}$ frequency/phase accumulator (FCIN[N+1] and PCIN[N+1]).

The required n-bit frequency increment value is split into m, p-bit sections each of which must be made available to the appropriate p-bit frequency/phase accumulator input, at the right time. This may be accomplished by pipelining the input values to the same depth as the corresponding frequency/phase accumulator, as shown in FIG. 2.

The p-bit phase outputs of each of the m, p-bit frequency/phase accumulators must be pipelined to compensate for the pipeline delay across the array of frequency/phase accumulators. This again is shown in FIG. 2.

Each frequency/phase accumulator produces one part of the required phase output value. At time T the first frequency/phase accumulator adds its frequency input, FIN[1,T], to its current frequency, CF[1,T−1] to produce a new current frequency CF[1,T] when the master clock is asserted. At time T the first phase accumulator adds the current frequency, CF[1, T−1] to the current phase CP[1,T−2] to produce the new current phase CP[1T−1] when the master clock is asserted.

Now consider the second frequency/phase accumulator in the chain. At time T the second frequency/phase accumulator adds its frequency input FIN[2,T−1] with the carry input from the previous (first) frequency/phase accumulator, FCIN[2, T−1], to the current frequency CF[2,T−2]. This gives a new current frequency CF[2,T−1] when the master clock is asserted. Similarly, at time T, the second phase accumulator is adding CF[2,T−2] with carry PCIN[2,T−2] to CP[2,T−3] to produce the new current phase CP[2,T−2] when the master clock is asserted.

In general the $N^{th}$ frequency/phase accumulator in the chain will be performing the following calculations:

$$CF[N,T-N+1] = FIN[N,T-N+1] + FCIN[N,T-N+1] + CF[N,T-N]$$

$$CP[N,T-N] = CF[N,T-N] + PCIN[N,T-N] + CP[N,T-N-1]$$

At time T, the output of the first frequency/phase accumulator is that for time T−2. The output for the $N^{th}$ frequency/phase accumulator is that for time T−N−1. Thus the output of the first accumulator must be delayed using M−1 pipeline registers to be correctly aligned with the output of the $M^{th}$ unit.

Figure 4:
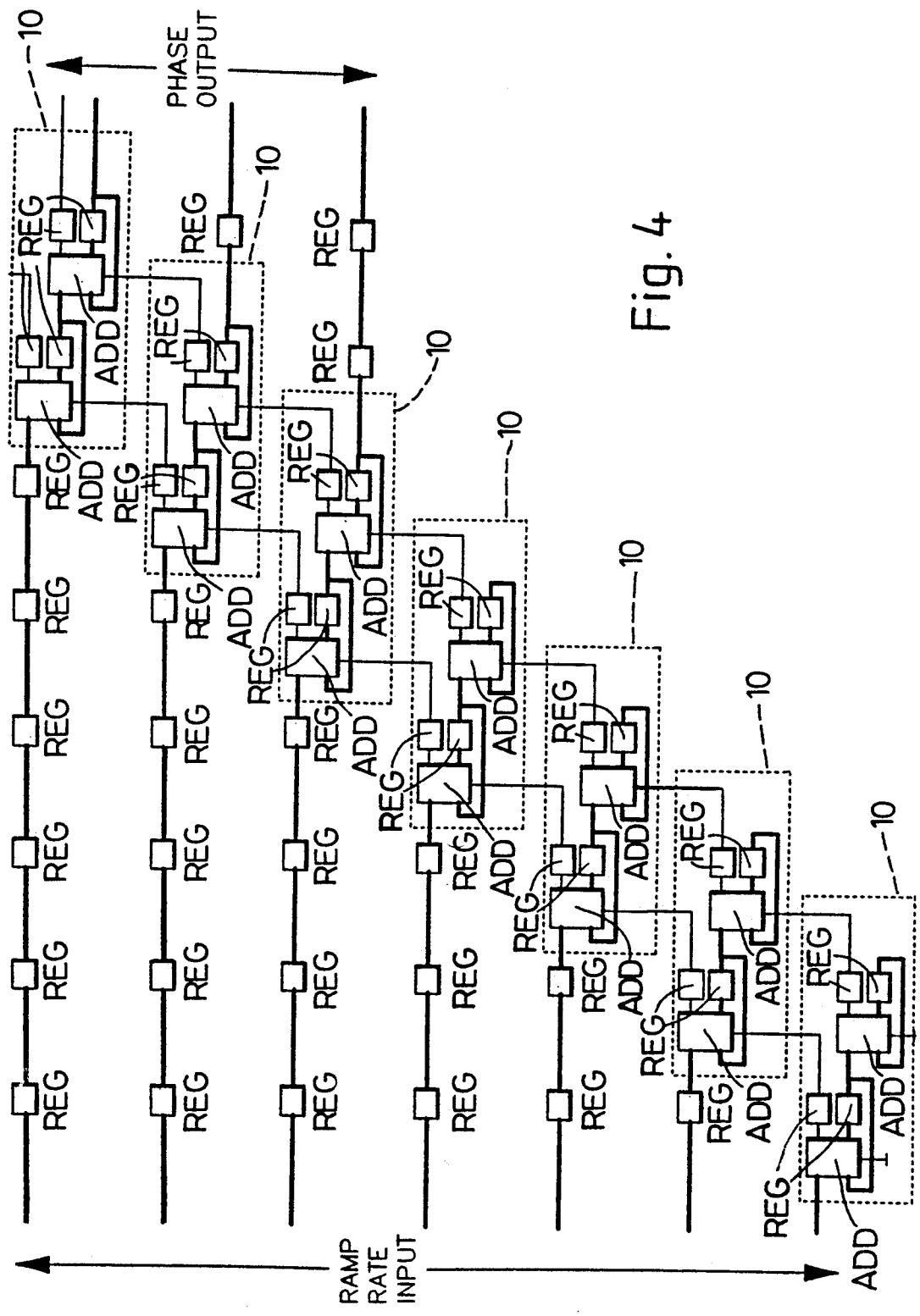
FIG. 4 is a block diagram of a second embodiment of a parallel-pipelined digital chirp generator in accordance with the invention.

Not all the outputs of the phase accumulators are required. The phase outputs are used to look-up a sine and/or cosine value from a look-up table as in the arrangement of FIG. 1. The look-up table will generally require an 8 to 10-bit address input to give adequate phase error in the generated chirp signal. This means that only the most significant Y-bits of the phase output are required where Y is the number of address bits for the sine/cosine look-up table. Consequently the pipeline registers connected to the remaining (least significant) phase outputs can be removed. The second embodiment, shown in FIG. 4, includes this modification.

Figure 5:
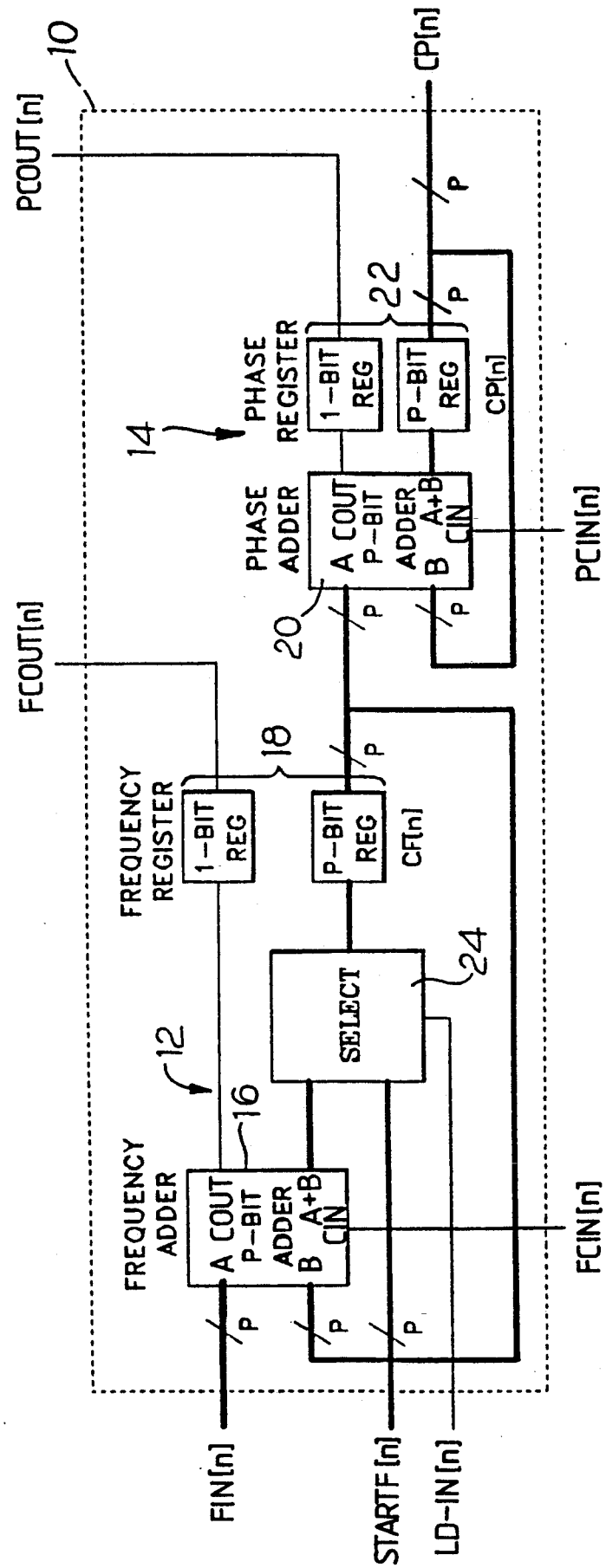
FIG. 5 is a block diagram of a frequency/phase accumulator modified to allow loading of the start frequency.

For digital chirp generation it is necessary to set the start frequency at the beginning of the chirp. This may be done by loading the start frequency value into the frequency register 18 at the beginning of the chirp, instead of loading the output of the frequency adder 16 (i.e. sum of the frequency increment and current frequency value). To do this it is necessary to be able to select either the output of the frequency adder 16 or the start frequency value as the source to be loaded into the frequency register. This scheme is shown in FIG. 5 where the frequency/phase accumulator of FIG. 3 is modified by inserting a select circuit 24 between the frequency adder 16 and the frequency register 18. The selection logic may be included within the adder logic depending upon the detailed circuit design. A selection control signal, LD_SF[n], selects the start frequency, STARTF[n], as the source for the frequency register, when it is asserted. Otherwise the output of the frequency adder is selected.

Note that it is not necessary to load the carry bit of the register when loading the start frequency because this will not be used by the next stage. The next stage (i.e. next frequency/phase accumulator in the chain) will load its start frequency value on the next clock pulse so it will not require the carry input from the previous stage.

Figure 6:
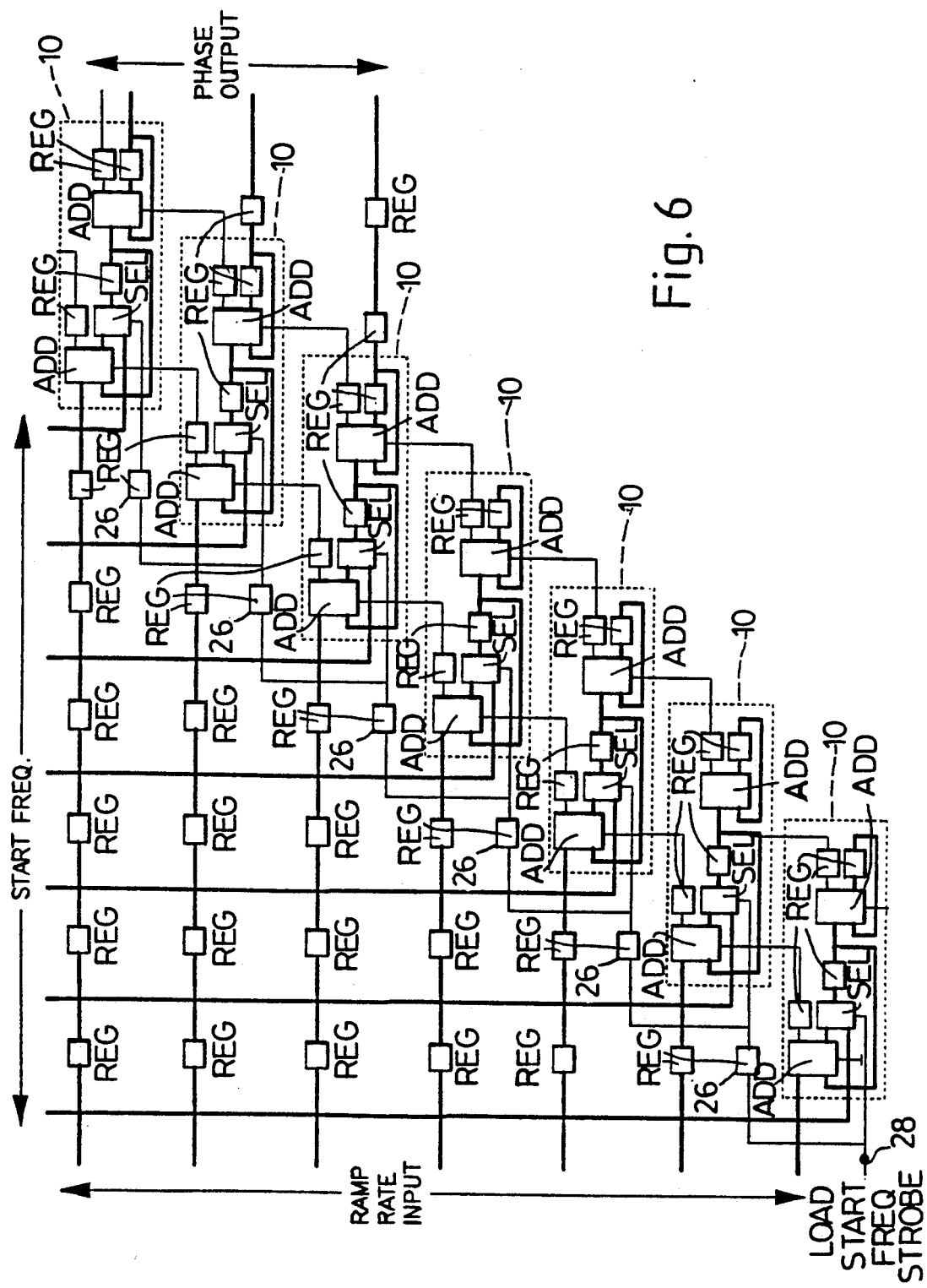
FIG. 6 is a block diagram of a third embodiment of a parallel-pipelined digital chirp generator in accordance with the invention and with pipelined control of the loading of the start frequency value.
Figure 7:
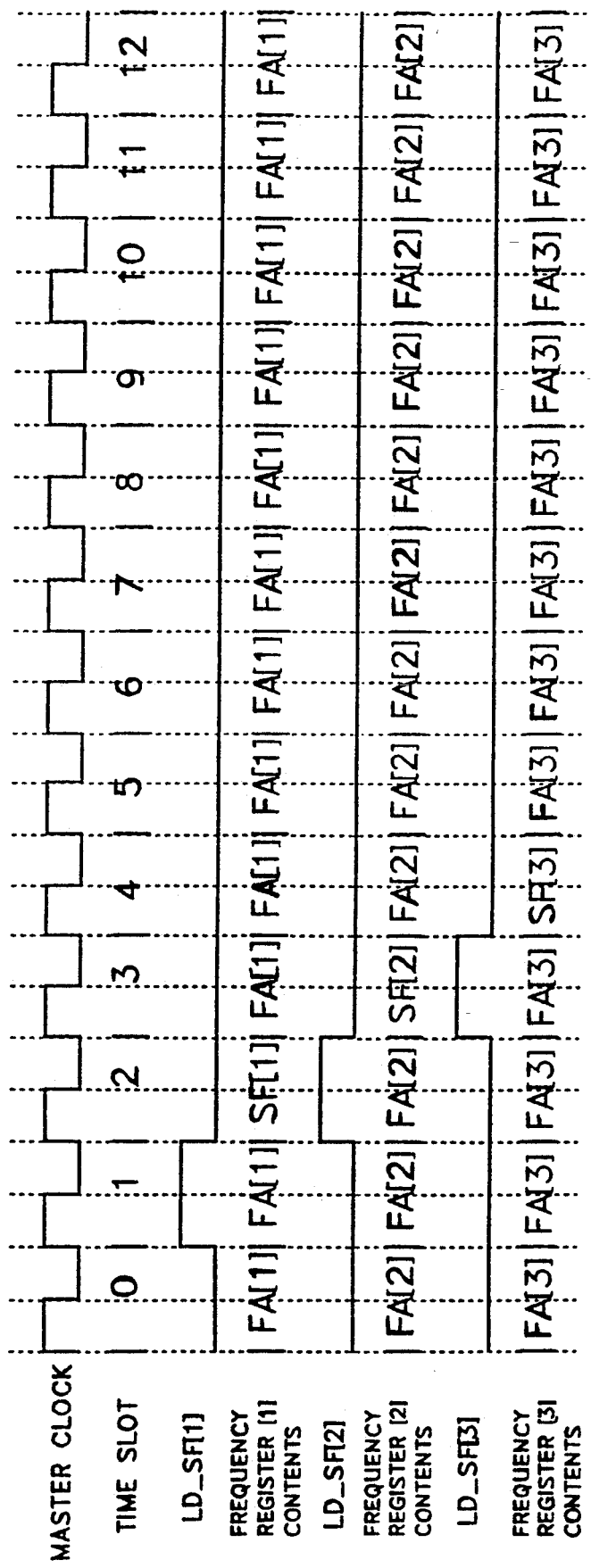
FIG. 7 is a timing diagram which illustrates the piplined loading of the start frequency in the third embodiment.
Figure 8:
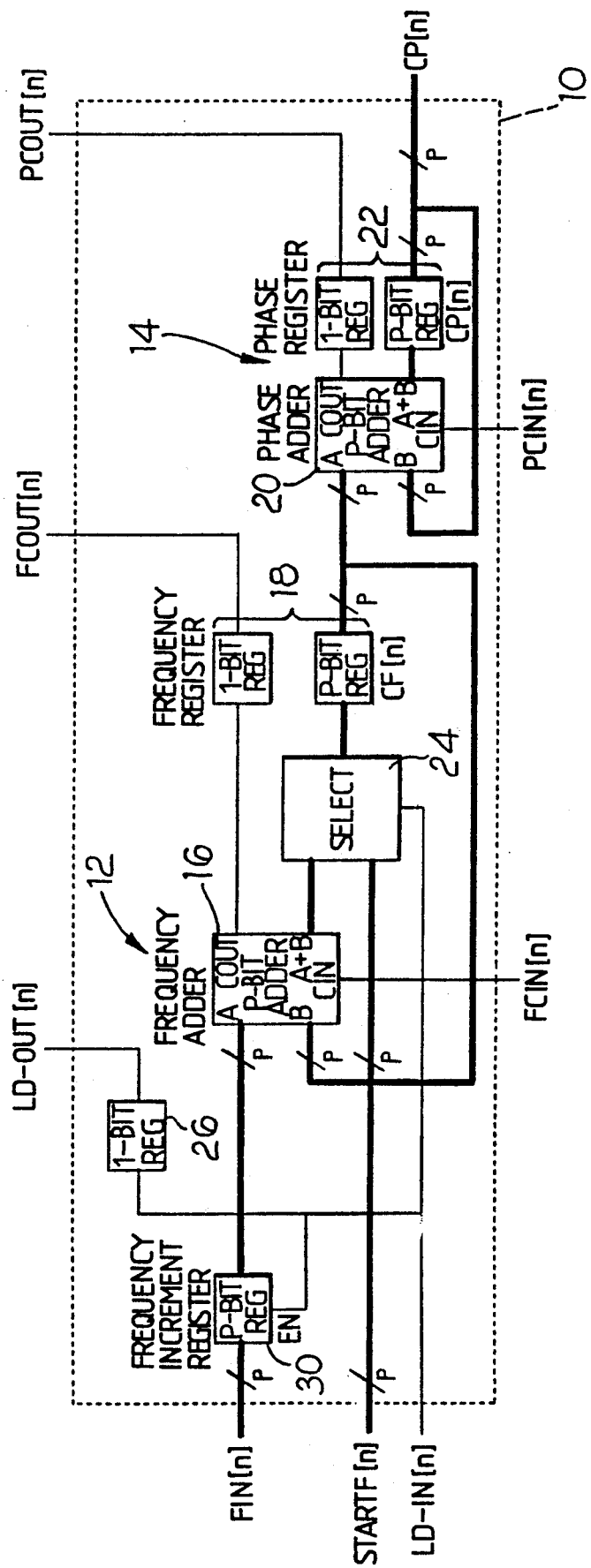
FIG. 8 is a block diagram of a frequency/phase accumulator including a frequency increment register, for use in the fourth and fifth embodiments of a digital chirp generator.

Referring now to FIGS. 6 to 8, a third embodiment implements a method of loading an initial start frequency value and/or an initial phase value which will now be described. The third embodiment is similar to FIG. 1, and makes use of the modified frequency/phase accumulator shown in FIG. 5. The proposed method for loading an initial phase value is analogous to the method for loading the start frequency value.

A master clock signal is used to load all the pipeline registers at the same time. The digital start frequency input is not pipelined but separated into sections which are fed directly into respective frequency/phase accumulators. As described above, each frequency accumulator includes a select circuit 24 which controls the source for the frequency register, see FIG. 5. When asserted, the selector control signal, $LS_{13} SF[n]$, selects the start frequency input, STARTF[n], as the input for the frequency register. Otherwise the output of the frequency adder is selected. The select circuits 24 are pipelined together via intermediate pipeline registers 26 and connected to a load terminal 28.

When it is required to load a new start frequency a "load start frequency strobe" signal, $LD_{13} SF[1]$ which is active for the duration of one period of the master clock is applied to the load terminal 28. This strobe signal is used as the select control signal for the first frequency/phase accumulator in the pipelined array. It selects the start frequency input as the source for the frequency register of the first frequency/phase accumulator, see FIGS. 6 and 7. The $LD_{13}$ SF[1] strobe signal is pipelined by a 1-bit register 26 and passed on to the second frequency/phase accumulator in the chain.

Now, during the next master clock period, the first frequency/phase accumulator performs normally, using the output of the frequency adder as the source for the frequency register. However, the $LD_{13}$ SF[2] signal for the second frequency/phase accumulator is now asserted so the start frequency input to the second frequency/phase accumulator is selected as the source for its frequency register.

The $LD_{13}$ SF[n] signal propagates down the associated chain of 1-bit pipeline registers 26, advancing one step after each master clock pulse. When the $LD_{13}$ SF[n] input to any frequency/phase accumulator is asserted it selects the start frequency input as the source for its frequency register. Thus each part of the entire start frequency value is loaded during the correct pipeline time slot.

It should be noted that it takes M cycles to load the complete start frequency value, where M is the number of frequency/phase accumulators in the array. The start frequency/phase value must not be altered during this period.

Figure 9:
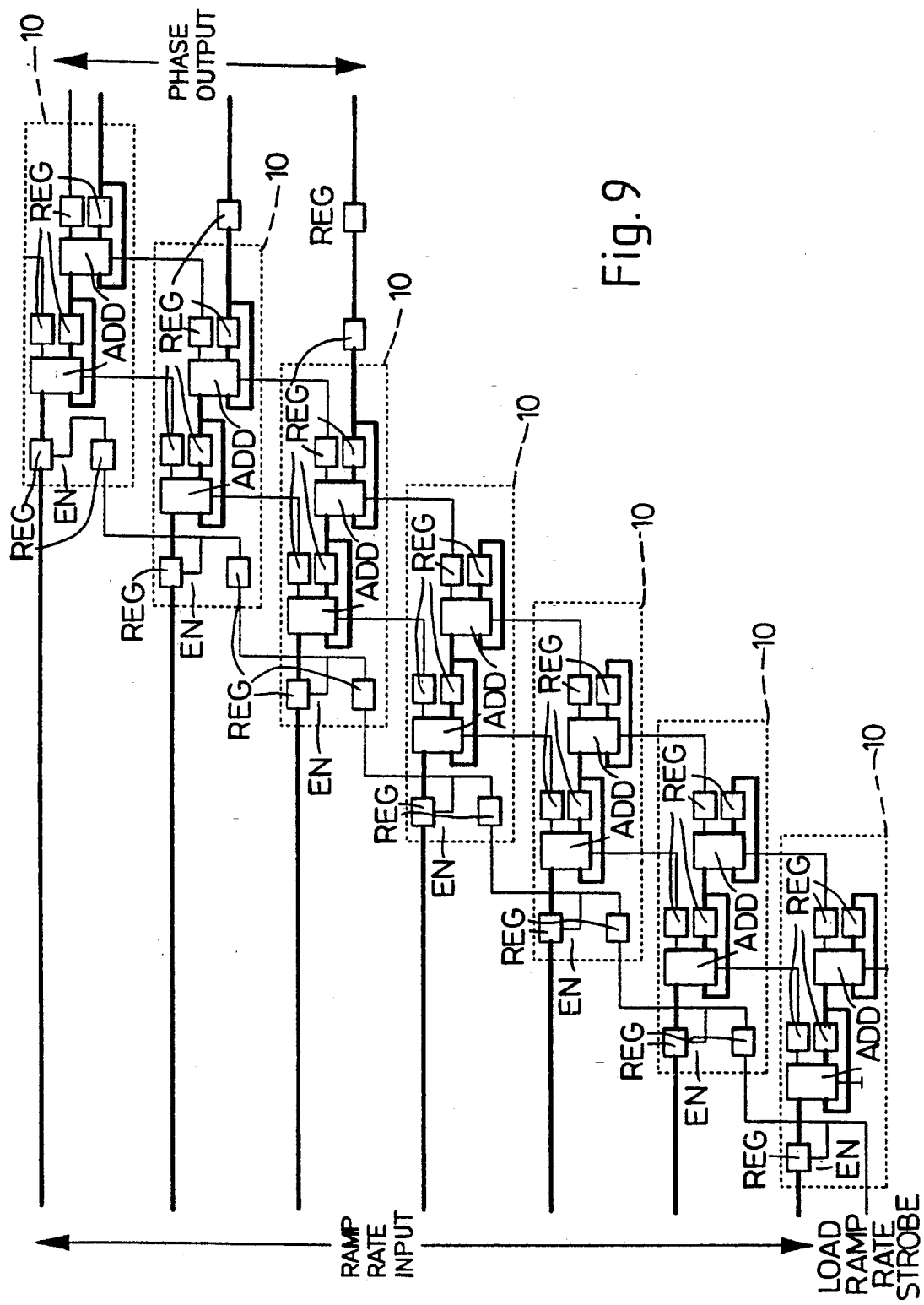
FIG. 9 is a block diagram of a fourth embodiment of a digital chirp generator with pipelined control of the loading of the frequency increment value in accordance with the invention and omitting the start frequency inputs and selectors for clarity.
Figure 10:
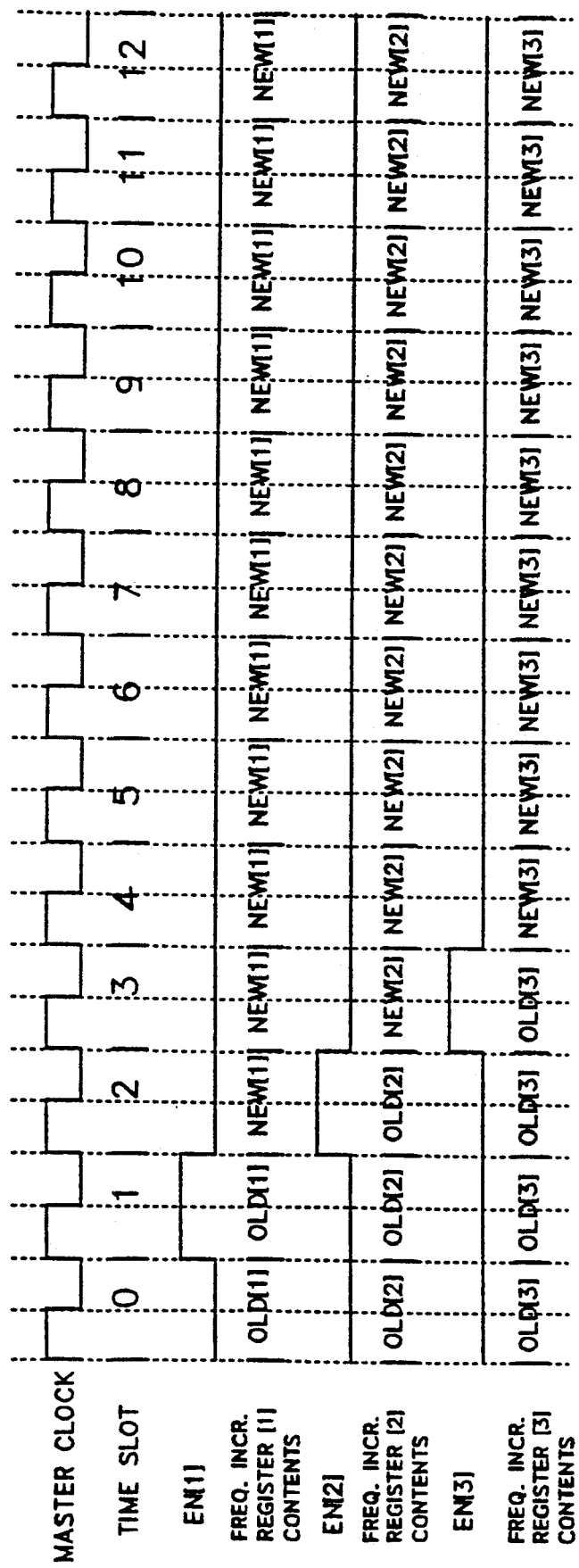
FIG. 10 is a timing diagram which illustrates the pipelined loading of the frequency increment value.

The fourth embodiment, described with reference to FIGS. 8 to 10, implements a method for loading the frequency increment value into the frequency/phase accumulator without the need for an array of pipeline registers to compensate for the pipeline delay in the frequency/phase accumulator array.

In the fourth embodiment, the frequency/phase accumulator is similar to that of FIG. 5 except that it includes a p-bit frequency increment register 30 for storing a frequency increment and being enabled by a signal pipelined between the adjacent frequency/phase accumulators.

A master clock signal is used to load all the pipeline registers at the same time. The p-bit frequency increment registers 30 hold the current value of the frequency increment, see FIG. 8. The digital frequency increment inputs to the digital chirp generator are not pipelined but separated into sections and fed directly to the input of the respective frequency increment registers 30 in all the frequency/phase accumulators. The latch enabling signal EN[n] is used, in each of the frequency/phase accumulators, to enable the loading of the new frequency increment value into the frequency increment register 30 when the master clock signal is asserted.

When it is required to load a new frequency increment value a "load ramp rate strobe" signal, EN[1], is generated, which is active for the duration of one period of the master clock. This strobe signal is used as the frequency increment latch enable signal for the first frequency/phase accumulator in the pipelined array. It loads the new frequency increment value into the frequency increment register of the first frequency/phase accumulator, see FIGS. 9 and 10. The EN[1] strobe signal is pipelined by a 1-bit register 26 and passed on to the second frequency/phase accumulator in the chain.

Now, during the next master clock period, the first frequency/phase accumulator will be able to use the new frequency increment value for its frequency accumulation operation. However, the EN[2] signal for the second frequency/phase accumulator is now asserted so the new frequency increment value will be loaded into the frequency increment register of the second frequency/phase accumulator.

The EN[n] signal propagates down the associated chain of 1-bit pipeline registers 26, advancing one step after each master clock pulse. When the EN[n] input to any frequency/phase accumulator is asserted it causes the new frequency increment value to be loaded into the corresponding frequency increment register. Thus each part of the entire frequency increment value is loaded into the frequency increment registers during the correct pipeline time slot.

It should be noted that it takes M cycles to load the complete frequency increment value, where M is the number of frequency/phase accumulators in the array. The new frequency increment value must not be altered during this period. This method may be extended to include simultaneous loading of the start phase value, start frequency value and frequency increment value. In this fourth embodiment, the start frequency value may be injected either in the manner described in connection with the third embodiment or in any other suitable manner.

Figure 11:
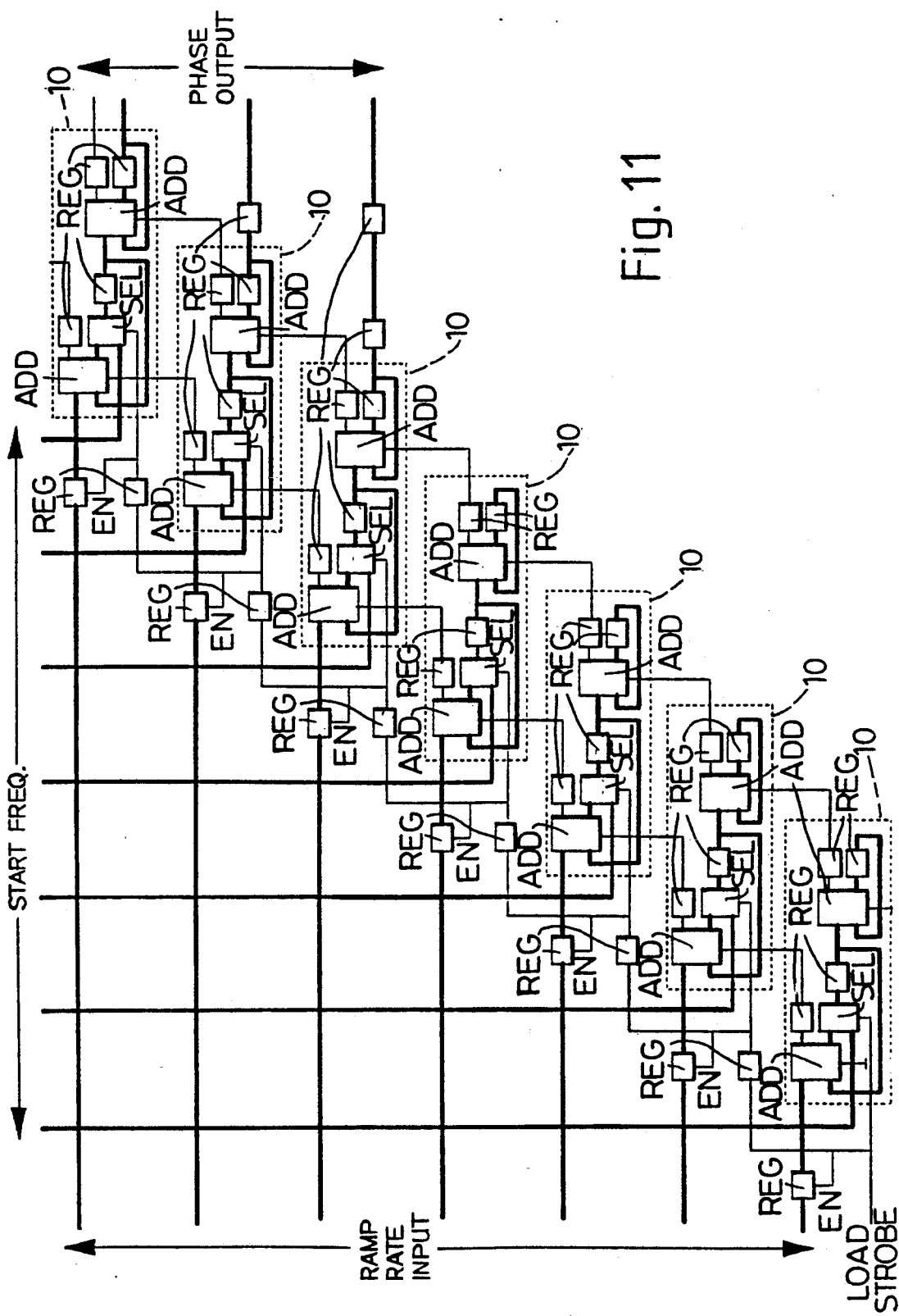
FIG. 11 is a block diagram of a fifth embodiment of a parallel-pipelined digital chirp generator with simultaneous loading of the frequency increment and start frequency and/or start phase values, in accordance with the invention.
Figure 12:
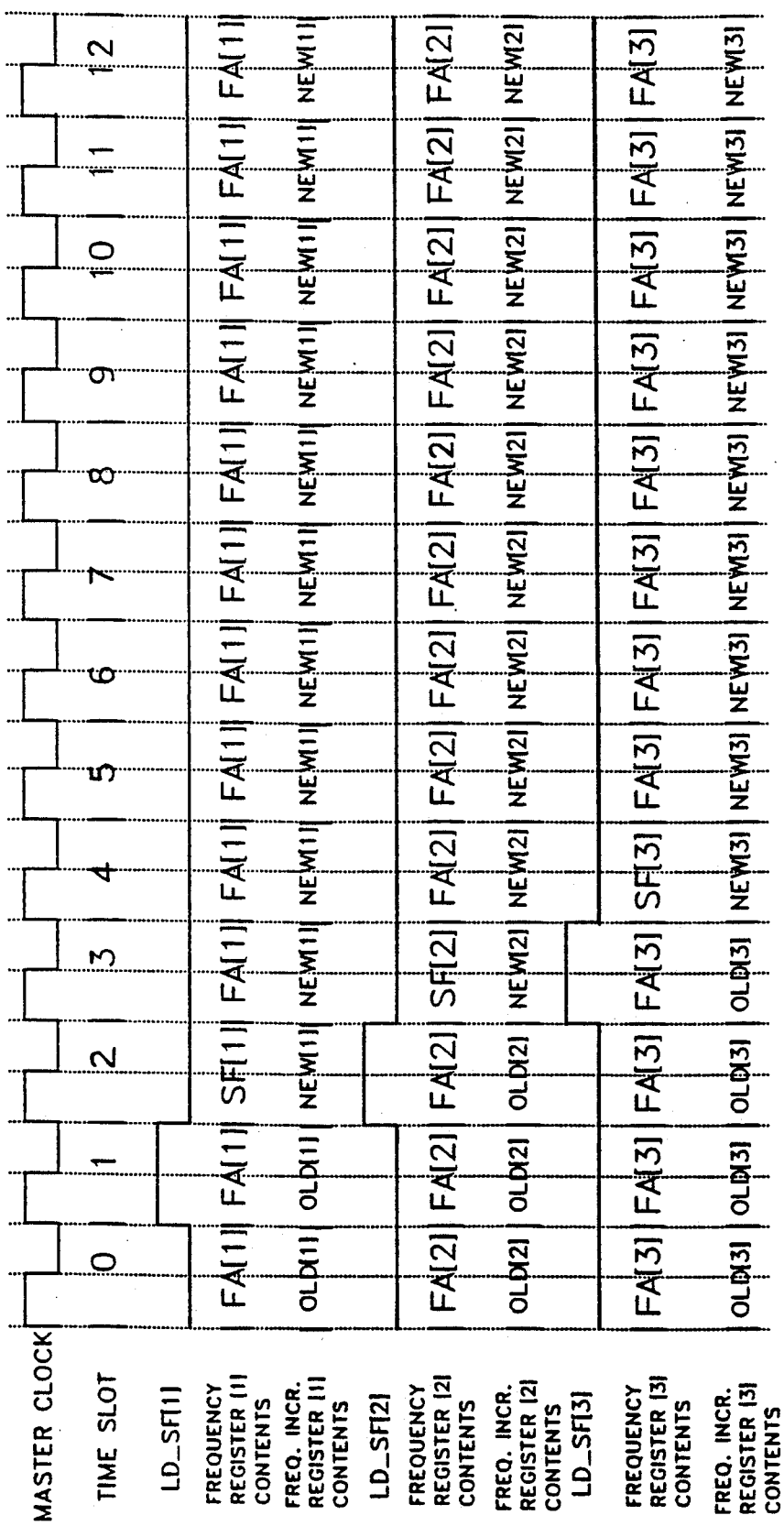
FIG. 12 is a timing diagram which illustrates the pipelined loading of the frequency increment and start frequency values in the fifth embodiment.

The fifth embodiment is similar to the previous embodiments and implements a method for simultaneously loading the frequency increment value and the start frequency value into the frequency/phase accumulator using a single pipelined control signal, without the need for an array of pipeline registers to compensate for the pipeline delay in the frequency/phase accumulator array. The embodiment will be described with reference to FIGS. 8, 11 and 12.

A master clock signal is used to load all the pipeline registers at the same time. A p-bit frequency increment register 30 has been included in each of the frequency/phase accumulators, to hold the current value of the frequency increment, together with a select circuit 24 which controls the source for the frequency register, see FIG. 8. The frequency increment inputs to the digital chirp generator are not pipelined but are separated into sections and fed directly to the input of the frequency increment register 30 in all the frequency/phase accumulators. A load signal LD[n] is used, in each of the frequency/phase accumulators, to enable the loading of the new frequency increment value into the frequency increment register 30 when the master clock signal is asserted. Similarly, the start frequency input is not pipelined but separated into sections and is fed directly into all the frequency/phase accumulators. The LD[n] signal, when asserted, causes the select circuit 24 to select the start frequency input as the source for the frequency register. When it is required to update the frequency increment and start frequency values a "load strobe" signal, LD[1], is generated, which is active for the duration of one period of the master clock. This strobe signal is used both as the frequency increment latch enable signal and as the selector control signal for the first frequency/phase accumulator in the pipelined array. It loads the new frequency increment value into the frequency increment register 30 of the first frequency/phase accumulator. Simultaneously it selects the start frequency input as the source for the frequency register 18, see FIGS. 11 and 12. The LD[1] strobe signal is pipelined by the 1-bit register 26 and passed on to the second frequency/phase accumulator in the chain.

Now, during the next master clock period, the first frequency/phase accumulator will be able to use the new frequency increment value and new start frequency value (current frequency) for its frequency accumulation operation. However, the LD[2] signal for the second frequency/phase accumulator is now asserted so the new frequency increment value will be loaded into the frequency increment register 30 of the second frequency/phase accumulator and the new start frequency will be loaded into its frequency register 18.

The LD[n] signal propagates down the associated chain of 1-bit pipeline registers 26, advancing one step after each master clock pulse. When the LD[n] input to any frequency/phase accumulator is asserted, it causes the new frequency increment value to be loaded into the corresponding frequency increment register 30 and the new start frequency value to be loaded into the corresponding frequency register 18. Thus each part of the entire frequency increment value and start frequency value is loaded into the frequency increment registers 30 and frequency registers 18, respectively, during the correct pipe-line time slot.

It should be noted that it takes M cycles to load the complete frequency increment value and start frequency value, where M is the number of frequency-/phase accumulators in the array. The new frequency increment value and start frequency value must not be altered during this period.

This method may be extended to include simultaneous loading of the start phase value, start frequency value and frequency increment value.

I claim:

1. A digital chirp generator comprising:
   a plurality of successively adjacent frequency/phase accumulators,
   each of said frequency/phase accumulators including a frequency accumulator means and a respective phase accumulator means driven by the respective frequency accumulator means,
   said plurality of frequency/phase accumulators being pipelined together including:
   each frequency accumulator means being pipelined to the frequency accumulator means in the next adjacent frequency/phase accumulator and
   each phase accumulator means being pipelined to the phase accumulator means in the next adjacent frequency/phase accumulator.

2. A digital chirp generator according to claim 1 including ramp rate input means for supplying successive sections of a digital frequency increment signal to successive ones of the frequency accumulators means.

3. A digital chirp generator according to claim 2, wherein the second and succeeding frequency/phase accumulators have associated therewith pipeline register means for progressively delaying the supply of said frequency increment signal sections, there being further pipeline register means associated with the outputs of said frequency/phase accumulators to align the outputs thereof.

4. A digital chirp generator according to claim 1, wherein each frequency/phase accumulator includes a frequency increment register for storing a section of a digital frequency increment signal, and enabling means for loading the section into the frequency accumulator means.

5. A digital chirp generator according to claim 4, wherein said enabling means are pipelined to a rate load terminal, whereby a rate load signal applied to said rate load terminal causes the respective sections to be loaded into associated frequency accumulator means.

6. A digital chirp generator according to claim 5, including pipeline register means between each of said enabling means whereby the respective sections are loaded successively.

7. A digital chirp generator according to claim 5, wherein the sections of said digital frequency increment signal are supplied directly to the frequency accumulator means.

8. A digital chirp generator according to claim 1, including frequency start input means for loading into each frequency accumulator means a respective section of a digital frequency start signal.

9. A digital chirp generator according to claim 8, wherein each frequency accumulator means includes a selector means responsive to a frequency control signal to input a respective section of a digital frequency start signal into the frequency accumulator means, end each of said selector means is interconnected to a frequency load terminal whereby a control signal supplied to said frequency load terminal causes the respective sections of the digital frequency start signal to be injected into the associated frequency accumulator means.

10. A digital chirp generator according to claim 9, wherein said frequency control means includes a pipeline register associated with each of said frequency accumulator means whereby the respective sections of the frequency start signal are injected in sequence into the associated frequency accumulator means.

11. A digital chirp generator according to claim 1, including phase start input means for loading a respective section of a digital phase start signal into each phase accumulator means.

12. A digital chirp generator according to claim 11, wherein each phase accumulator means includes a selector means responsive to a phase control signal to input a respective section of a digital phase start signal into the phase accumulator means, there being phase control means pipelining each of said selector means to a phase load terminal whereby a control signal supplied to said phase load terminal causes the respective sections of the digital phase start signal to be injected into the associated phase accumulator means.

13. A digital chirp generator according to claim 9, wherein said phase control means includes a pipeline register associated with each of said phase accumulator means whereby the respective sections of a phase start signal are injected in sequence into the associated phase accumulator means.

14. A digital chirp generator according to claim 8, wherein the frequency start signal is supplied directly to the frequency accumulator means.

15. A digital chirp generator according to claim 11, wherein the phase start signal is supplied directly to the phase accumulator means.

16. A digital chirp generator according to claim 1 wherein changes in at least two of frequency increment, start frequency and start phase signals are initiated in response to a common control signal.

17. A digital chirp generator according to claim 1, wherein each frequency/phase accumulator is a one bit accumulator.

18. A digital chirp generator according to claim 1, wherein each frequency/phase accumulator is a two or more bit accumulator.

19. A digital chirp generator according to claim 1, claim, wherein the frequency accumulator means have a bit capacity different to that of the phase accumulator means.

* * * * *